United States Patent
Ito et al.

(10) Patent No.: US 8,035,120 B2
(45) Date of Patent: Oct. 11, 2011

(54) SEMICONDUCTOR LIGHT EMITTING DEVICE AND SEMICONDUCTOR LIGHT EMITTING DEVICE ASSEMBLY

(75) Inventors: Yasushi Ito, Kanagawa (JP); Naoji Nada, Kanagawa (JP)

(73) Assignee: Sony Corporation, Tokyo (JP)

( * ) Notice: Subject to any disclaimer, the term of this patent is extended or adjusted under 35 U.S.C. 154(b) by 708 days.

(21) Appl. No.: 11/656,358

(22) Filed: Jan. 22, 2007

(65) Prior Publication Data

US 2007/0170448 A1    Jul. 26, 2007

(30) Foreign Application Priority Data

Jan. 24, 2006 (JP) ................. P2006-014893

(51) Int. Cl.
*H01L 33/00* (2010.01)
(52) U.S. Cl. ....... 257/98; 257/79; 257/100; 257/E33.06; 257/E33.061; 257/E33.068; 313/512
(58) Field of Classification Search ............. 257/79–103
See application file for complete search history.

(56) References Cited

U.S. PATENT DOCUMENTS

| | | | | |
|---|---|---|---|---|
| 6,650,044 B1 * | 11/2003 | Lowery | ........................ | 313/502 |
| 6,717,362 B1 * | 4/2004 | Lee et al. | ...................... | 313/512 |
| 6,878,973 B2 * | 4/2005 | Lowery et al. | ................. | 257/100 |
| 7,141,825 B2 * | 11/2006 | Horio et al. | ...................... | 257/79 |
| 7,473,939 B2 * | 1/2009 | Wu et al. | ........................... | 257/99 |
| 2002/0163302 A1 * | 11/2002 | Nitta et al. | ..................... | 313/512 |
| 2004/0012027 A1 * | 1/2004 | Keller et al. | ..................... | 257/79 |
| 2005/0139842 A1 * | 6/2005 | Murofushi et al. | ............. | 257/79 |
| 2006/0091788 A1 * | 5/2006 | Yan | ................................ | 313/502 |
| 2006/0138443 A1 * | 6/2006 | Fan et al. | ....................... | 257/100 |

FOREIGN PATENT DOCUMENTS

| | | |
|---|---|---|
| JP | 01-223780 A | 9/1989 |
| JP | 2989787 | 10/1999 |
| JP | 3155925 | 2/2001 |
| JP | 2003-101075 A | 4/2003 |
| JP | 3439582 | 6/2003 |
| JP | 3491660 | 11/2003 |
| JP | 2005-039264 A | 2/2005 |
| JP | 2007-109915 A | 4/2007 |

* cited by examiner

*Primary Examiner* — Kiesha Bryant
*Assistant Examiner* — Eric Ward
(74) *Attorney, Agent, or Firm* — Wolf, Greenfield & Sacks, P.C.

(57) ABSTRACT

A semiconductor light emitting device capable of improving the light extraction efficiency while preventing deterioration of the light emission characteristic with time and a semiconductor light emitting device assembly including the semiconductor light emitting device are provided. The semiconductor light emitting device includes a semiconductor light emitting element containing a metal element, a cap portion formed from a material which contains a sulfur or halogen element and which is capable of transmitting the light from the semiconductor light emitting element, and a shielding film which is disposed between the semiconductor light emitting element and the cap portion, which transmits the light from the semiconductor light emitting element to the cap portion, and which separates the semiconductor light emitting element side and the cap portion side.

21 Claims, 8 Drawing Sheets

SEMICONDUCTOR LIGHT EMITTING DEVICE AND SEMICONDUCTOR LIGHT EMITTING DEVICE ASSEMBLY

CROSS REFERENCES TO RELATED APPLICATIONS

The present invention contains subject matter related to Japanese Patent Application JP 2006-014893 filed in the Japanese Patent Office on Jan. 24, 2006, the entire contents of which are incorporated herein by reference.

BACKGROUND OF THE INVENTION

1. Field of the Invention

The present invention relates to a semiconductor light emitting device including a cap portion formed from a resin material and a semiconductor light emitting device assembly to be used for a light source device including the semiconductor light emitting device.

2. Description of the Related Art

In recent years, with respect to light emitting diodes (LEDs) including GaN based semiconductors or InGaN based semiconductors, so-called back emitting (flip chip type) LEDs have become in the mainstream in order to improve light extraction efficiency. In the flip chip type LED, a semiconductor layered structure including an active layer is disposed between a transparent substrate and a reflection electrode and, thereby, the light generated from the active layer is emitted from the back side (transparent substrate side).

FIG. 11 shows an example of a cross-sectional configuration of a known semiconductor light emitting device (LED device 101) including a flip chip type LED. In the LED device 101, an LED chip 102 which generates emitted light L101 is disposed on a sub-mount substrate 131, and electrodes (not shown in the drawing) in the LED chip 102 are electrically connected to lead frame electrodes 141A and 141B with bonding wires 142A and 142B. The sub-mount substrate 131 is bonded to a slug 132, which is a heat dissipation structure, with a thermally conductive adhesive 133. The slug 132 and a part of the lead frame electrodes 141A and 141B are covered with a case 143. The circumference of the LED chip 102 is also covered with a filler 154 and a cap 152 so as to be sealed against the outside.

For example, a highly flexible material, e.g., silicone gel, or a highly fluid material is used as the filler 154. On the other hand, for the cap 152, an epoxy resin or the like is used, and besides, resin materials have been proposed, as described in Japanese Patent Nos. 2989787, 3155925, 3439582, and 3491660, for example. When hard materials, e.g., epoxy based resins, are used, fillers also function as caps.

SUMMARY OF THE INVENTION

In order to increase the light extraction efficiency of the LED device, it is desirable that the refractive indices of the filler and the cap are allowed to become as close to the refractive index of the LED chip portion (a transparent substrate for a flip chip type LED) as possible. This is because Fresnel reflection at the interfaces thereof is suppressed and a critical angle causing occurrence of the total reflection is increased.

Usually, a sapphire substrate is used as the transparent substrate. Therefore, the refractive index of the transparent substrate is about 1.70 to 1.80. On the other hand, the refractive indices of the filler and the cap are significantly small as compared with that of the sapphire substrate. For example, the refractive indices of epoxy based resins are about 1.40 to 1.55. Consequently, as is clear from, for example, the characteristic diagram shown in FIG. 12, the light extraction efficiency is decreased by about 15% to 20% as compared with that in the case where the refractive indices of the filler and the cap are high (about 1.80).

Since the resin materials described in the above-described Japanese Patent Nos. 2989787, 3155925, 3439582, and 3491660 have high refractive indices of about 1.70 to 1.74 close to that of the sapphire substrate in the flip chip type LED, it is believed that the light extraction efficiency can be improved than ever.

However, it has been made clear that since all these high refractive index resin materials contain a sulfur (S) or halogen element having high reactivity with a metal element, e.g., silver (Ag), the light emission characteristic of the LED device has deteriorated with time as is indicated by, for example, the characteristic diagram shown in FIG. 13 (the change in amount of luminous flux emitted from the LED device with time under the condition of the current in a forward direction If of 350 mA and the environmental temperature of 85° C.).

Specifically, since the above-described metal element is used in the electrode in the LED chip, the thermally conductive adhesive for bonding the sub-mount substrate to the slug, and the like, a reaction with a sulfur or halogen element occurs easily by ion migration. Consequently, for example, Ag is converted to brown silver sulfide (AgS) or a silver halide through the reaction and, therefore, the light emission characteristic of the LED device deteriorates with time.

As described above, in the known technology, the resin material containing a sulfur or halogen element is used necessarily as the filler or the cap and, therefore, it is difficult to improve the light extraction efficiency while deterioration of the light emission characteristic with time is prevented.

The present invention has been made in consideration of the above-described problems. It is desirable to provide a semiconductor light emitting device capable of improving the light extraction efficiency while preventing deterioration of the light emission characteristic with time and a semiconductor light emitting device assembly including the above-described semiconductor light emitting device.

A semiconductor light emitting device according to an embodiment of the present invention is provided with a semiconductor light emitting element containing a metal element, a cap portion formed from a material which contains a sulfur (S) or halogen element and which is capable of transmitting the light from the above-described semiconductor light emitting element, and a shielding film which is disposed between the semiconductor light emitting element and the cap portion, which transmits the light from the semiconductor light emitting element to the cap portion, and which separates the semiconductor light emitting element side and the cap portion side.

A semiconductor light emitting device assembly according to another embodiment of the present invention may be used for light source devices of backlight and the like, and a plurality of the above-described semiconductor light emitting devices are mounted on a wiring substrate.

In the semiconductor light emitting device and the semiconductor light emitting device assembly according to embodiments of the present invention, the semiconductor light emitting element side and the cap portion side are separated by the shielding film. Therefore, the reaction between the metal element in the semiconductor light emitting element and a sulfur (S) or halogen element in the cap portion is prevented. The same holds true regarding the semiconductor light emitting device and the semiconductor light emitting device assembly in which a luminophor having reactivity is added to the cap portion. Examples thereof include a white LED device in which a luminophor of an alkaline earth metal sulfide is added to a cap portion formed from a resin.

In a semiconductor light emitting device according to an embodiment of the present invention, when the refractive index of the above-described cap portion is represented by nc, the refractive index of the above-described shielding film is represented by np, and the refractive index of the component, which is in contact with the above-described shielding film on the semiconductor light emitting element side, is represented by ni, preferably, the refractive index of the shielding film satisfies the following formula (1) or (2). In this configuration, the difference in refractive index between the semiconductor light emitting device and the cap portion is moderated by the shielding film, and Fresnel reflection is reduced when the light is emitted from the semiconductor light emitting element toward the outside.

$$ni \leq np \leq nc \quad (1)$$

$$ni \geq np \geq nc \quad (2)$$

In the semiconductor light emitting device or the semiconductor light emitting device assembly according to an embodiment of the present invention, the shielding film is disposed between the semiconductor light emitting element and the cap portion. Therefore, the reaction between the metal element and a sulfur (S) or halogen element may be prevented, so that the light extraction efficiency may be improved while deterioration of the light emission characteristic with time may be prevented.

In particular, in the case where the refractive index of the shielding film is allowed to satisfy the above-described formula (1) or (2), the Fresnel reflection may be reduced when the light is emitted from the semiconductor light emitting element toward the outside, so that the light extraction efficiency may be further improved.

DESCRIPTION OF THE PREFERRED EMBODIMENTS

The embodiments according to the present invention will be described below in detail with reference to the drawings.

First Embodiment

Figure 1:
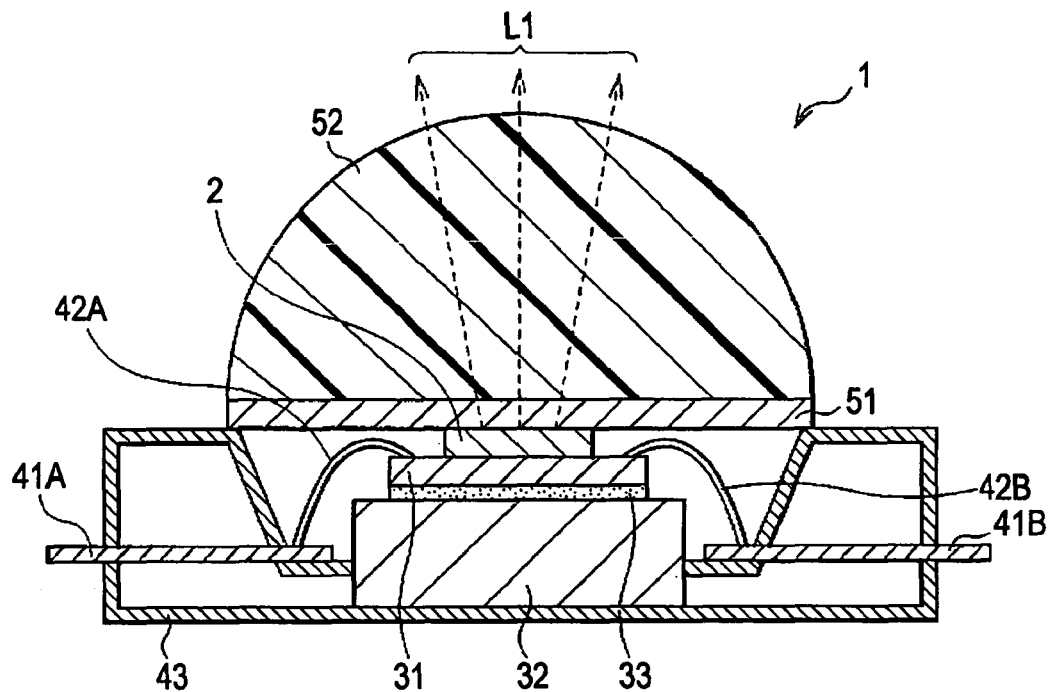
FIG. 1 is a sectional view showing the configuration of a semiconductor light emitting device according to a first embodiment of the present invention.

FIG. 1 shows a cross-sectional configuration of a semiconductor light emitting device (LED device 1) according to the first embodiment of the present invention.

In this LED device 1, an LED chip 2, which emits light L1, is disposed on a sub-mount substrate 31. The sub-mount substrate 31 is electrically connected to lead frame electrodes 41A and 41B with bonding wires 42A and 42B. The back of the sub-mount substrate 31 is bonded to a slug 32, which is a heat dissipation structure, with a thermally conductive adhesive 33. The slug 32 and a part of the lead frame electrodes 41A and 41B are covered with a case 43. A hemispherical cap 52 with an upper portion having a convex surface is disposed on the LED chip 2 and the case 43. A shielding film 51 is disposed uniformly between this cap 52 and the LED chip 2, that is, on the bottom of the cap 52.

Figure 2:
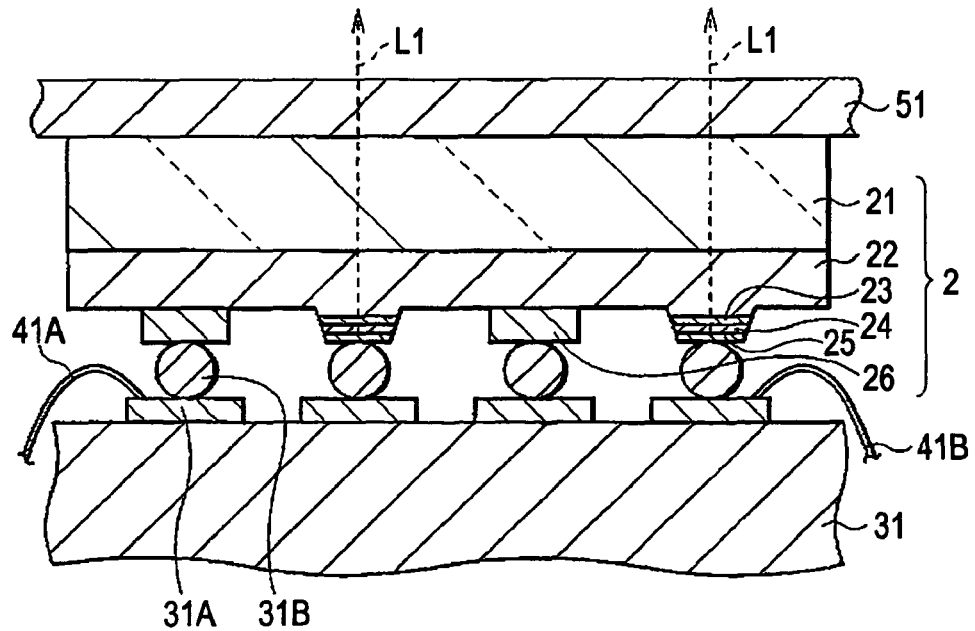
FIG. 2 is a sectional view showing a detailed configuration of the LED chip shown in FIG. 1 and its vicinity.

FIG. 2 shows a cross-sectional configuration of a part (LED chip 2 and its vicinity) of this LED device 1 in detail.

This flip chip type LED chip 2 has a transparent substrate 21 as a substrate. The shielding film 51 on the cap 52 side is adhered to the surface of this transparent substrate 21. An n-type clad layer 22 is disposed uniformly on the back of the transparent substrate 21. An n-type electrode 26 is disposed on a part of the n-type clad layer 22, and an active layer 23, a p-type clad layer 24, and a p-type electrode 25 are disposed sequentially on another part while constituting a ridge-shaped layered structure. Each of the n-type electrode 26 and the p-type electrode 25 is electrically connected to an electrode 31A on the sub-mount substrate 31 with a bump 31B formed from solder or the like. That is, the n-type electrode 26 is electrically connected to the lead frame electrode 41A via the bump 31B, electrode 31A, and the bonding wire 42A. The p-type electrode 25 is electrically connected to the lead frame electrode 41B via the bump 31B, electrode 31A, and the bonding wire 42B. By the above-described configuration, the LED chip 2 emits the light generated from the active layer 23 finally through the cap portion 52 from the upper portion (emitted light L1).

The transparent substrate 21 is a substrate transparent with respect to the light from the active layer 23, and is composed of a sapphire substrate, for example. The active layer 23 is composed of a semiconductor material not containing impurity added and functions as a light-emitting region which emits light due to a current supplied. The n-type clad layer 22 and the p-type clad layer 24 are composed of a n-type semiconductor multilayer film and a p-type semiconductor multilayer film, respectively, and supply electrons or holes to the active layer 23. Each of the n-type clad layer 22, the active layer 23, and the p-type clad layer 24 is composed of, for example, a GaN based or InGaN based semiconductor or the like which is a green·blue-emitting material and which covers the wavelength range of about 430 to 560 nm.

Each of the n-type electrode 26 and the p-type electrode 25 is to supply a current to the active layer 23, and is connected to a direct current power supply (not shown in the drawing) via the lead frame electrodes 41A and 41B, respectively. The p-type electrode 25 also functions as a reflection electrode for reflecting and leading the light on the p-type electrode 25 side among the light from the active layer 23 to the transparent substrate 21 side. The n-type electrode 26 is composed of a metal element, e.g., titanium (Ti), having a small work function. The p-type electrode is composed of a metal element, e.g., silver (Ag), gold (Au), or aluminum (Al), having a high reflectance. This p-type electrode 25 corresponds to a specific example of "an electrode formed from a metal element" according to an embodiment of the present invention.

FIG. 1 will be further described. The thermally conductive adhesive 33 is formed from an adhesive containing the above-described metal element, and is composed of a thermally conductive epoxy based adhesive containing Ag, for example. This thermally conductive adhesive 33 corresponds to a specific example of "a component containing a metal element" according to an embodiment of the present invention.

The cap 52 is to seal the LED chip 2 against the outside and, in addition, to transmit the light from the LED chip 2 so as to emit the light to the outside. The component of the cap 52 may be a high refractive index resin material containing a sulfur (S) or halogen element. Specific examples thereof include a sulfur-containing polyurethane based resin (refractive index: 1.70), a sulfur-containing acrylic resin (refractive index: 1.70), and a sulfur-containing epoxy based resin (refractive index: 1.70).

The shielding film 51 is disposed between the LED chip 2 and the cap 52 and performs a function of transmitting the light L1 from the LED chip 2 while blocking the movement of elements between the LED chip 2 and the cap 52. Specifically, entrance of metal elements contained in the p-type electrode 25 and the thermally conductive adhesive 33 in the LED chip 2 into the cap 52 through ion migration is blocked and, thereby, the reaction between these metal elements and the sulfur or halogen element in the cap 52 is prevented.

When the refractive index of the resin material in the cap 52 is represented by nc, the refractive index of the shielding film 51 is represented by np, and the refractive index of the component, which is in contact with the shielding film on the LED chip 2 side, is represented by ni, it is desirable that the refractive index of the shielding film 51 satisfies the following formula (1) or (2). This is because when the shielding film 51 is composed of the material satisfying such a condition, the difference in refractive index between the LED chip 2 and the cap 52 is moderated by the shielding film 51, and Fresnel reflection at each interface (the interface between the transparent substrate 21 in the LED chip 2 and the shielding film 51 and the interface between the shielding film 51 and the cap 52) is reduced when the light is emitted from the LED chip 2 toward the outside. In the LED device 1 of the present embodiment, since this LED chip 2 is of flip chip type, the component, which becomes in contact with the shielding film 51 on the LED chip 2 side, is the transparent substrate 21.

$$ni \leq np \leq nc \quad (1)$$

$$ni \geq np \geq nc \quad (2)$$

When the wavelength of the light L1 of the LED chip 2 and the like in a maximum peak intensity region is represented by λ and the film thickness of the shielding film 51 is represented by dp, it is more desirable that the refractive index and the film thickness of the shielding film 51 satisfy the following formula (3). This is because when the shielding film 51 is composed of the material satisfying such a condition, Fresnel reflection at the interface between the transparent substrate 21 in the LED chip 2 and the shielding film 51 and the interface between the shielding film 51 and the cap 52 is further reduced by the interference of the luminous flux.

$$(np \times dp) = (2m+1) \times \lambda/4 \text{ (where } m \text{ is an integer of 0 or more)} \quad (3)$$

In the above-described formula (3), when the above-described semiconductor layered structure is composed of, for example, a green-emitting material, e.g., InGaN, the peak lasing wavelength (the wavelength λ of the light L1 in a maximum peak intensity region) of the LED chip 2 is about 530±20 nm, and is about 460±20 nm when the layered structure is composed of a blue-emitting material, e.g., InGaN.

It is further desirable that the refractive index of the shielding film 51 satisfies the following formula (4). When the shielding film 51 is composed of the material satisfying such a condition, Fresnel reflection is reduced as in the above-described formula (3), and the Fresnel reflection of the light L1 corresponding to the peak lasing wavelength λ in the formula (3) becomes 0.

$$np = (ni \times nc)^{1/2} \quad (4)$$

Specifically, the shielding film 51 is composed of a material shown in Table 1, for example. That is, it is composed of, for example, silicon oxide ($SiO_2$), silicon nitride ($Si_3N_4$), aluminum oxide ($Al_2O_3$), aluminum nitride (AlN), magnesium oxide (MgO), tin oxide (SnO), zinc oxide (ZnO), indium oxide ($In_2O_3$), neodymium oxide ($Nd_2O_3$), titanium oxide ($TiO_2$), or zirconium oxide ($ZrO_2$).

TABLE 1

| Material | Refractive index | Remarks |
|---|---|---|
| $SiO_2$ | 1.46 | |
| $Si_3N_4$ | 1.90 | |
| $Al_2O_3$ | 1.76 | |
| (Sapphire) | (1.76) | Transparent substrate |
| AlN | 2.15 | |
| MgO | 1.75 | |
| SnO | 1.90 | |
| ZnO | 1.95 | |
| $In_2O_3$, $Nd_2O_3$ | 2.00 | |
| $TiO_2$ | 2.20~2.70 | |
| $ZrO_2$ | 2.10 | |
| (GaN) | (2.40) | G, B-emitting material |
| (AlInGaP) | (2.86) | R-emitting material |
| (GaAs, AlGaAs) | (3.30~3.90) | R-emitting material |

Alternatively, the shielding film 51 may be composed of a combination of the above-described materials, that is, the shielding film 51 may be configured to contain at least one type selected from the group consisting of these materials. When the shielding film 51 is composed of such a mixture of the materials, the refractive index of the shielding film 51 can be adjusted freely by changing the compositional ratio of each material.

In Table 1, in addition to the constituent materials of the above-described shielding film 51, sapphire (refractive index: 1.76), which is an example of constituent materials of the transparent substrate 21, GaN (refractive index: 2.40) which is a green-blue-emitting material and which is an example of constituent materials of the semiconductor layered structure in the LED chip 2, and GaAs and AlGaAs (refractive indices: 3.30 to 3.90) which are red-emitting materials and which are examples of constituent materials of the semiconductor layered structure in the LED chip 6 of a second embodiment, as described below, are also shown.

This LED device 1 can be produced as described below, for example.

The LED chip 2 is formed. Specifically, the n-type clad layer 22, the active layer 23, and the p-type clad layer 24 composed of the above-described materials are epitaxially grown sequentially on the transparent substrate 21 composed of the above-described material by, for example, a metal organic chemical vapor deposition (MOCVD) method or a molecular beam epitaxy (MBE) method so as to form a semiconductor layered structure. Subsequently, a part of the n-type clad layer 22, the active layer 23, and the p-type clad layer 24 are worked into predetermined shapes in order to ensure the position for forming the n-type electrode 26 on the n-type clad layer 22. This working into the predetermined shape is performed by, for example, reactive ion etching (RIE) or focused ion beam etching (FIB). The n-type electrode 26 is formed on a part of the n-type clad layer 22, and the p-type electrode 25 is formed on the p-type clad layer 24 by an evaporation method, for example. In this manner, the LED chip 2 shown in FIG. 2 is formed.

The resulting LED chip 2 is disposed on the sub-mount substrate 31 by using a bump 31B formed from solder or the like. At this time, as shown in FIG. 2, alignment is performed in such a way that the n-type electrode 26 and the p-type electrode 25 on the LED chip 2 are electrically connected to the electrode 31A on the sub-mount substrate 31 with the bumps 31B therebetween. Subsequently, the sub-mount substrate 31 is bonded to the slug 32 with the thermally conductive adhesive 33 composed of the above-described material.

The slug 32 and a part of the lead frame electrodes 41A and 41B are attached to the case 43. The bonding wires 42A and 42B are allowed to connect between the n-type electrode 26 and the p-type electrode 25 on the LED chip 2 and the lead frame electrodes 41A and 41B, respectively, so that these are electrically connected to each other.

On the other hand, the cap 52 is formed by using the above-described resin material, as described below. That is, the hemispherical cap 52 shown in FIG. 1, for example, is formed by molding a thermosetting resin or an ultraviolet curable resin, for example.

The shielding film 51 composed of the above-described material is formed to have a uniform thickness of about 220 to 230 nm on the flat surface side of the resulting cap 52 by, for example, a reactive DC sputtering method, in which oxygen ($O_2$) or nitrogen ($N_2$) is introduced, or an RF sputtering method.

Finally, the thus formed structure composed of the LED chip 2, the sub-mount substrate 31, the slug 32, the lead frame electrodes 41A and 41B, and the case 43 and the structure composed of the cap 52 and the shielding film 51 are opposed to each other and are joined. Specifically, a neighborhood of the edge of the cap 52 and the case 43 are bonded with a resin in such a way that the LED chip 2 and the shielding film 51 are adhered and, thereby, the above-described two structures are joined to each other. In this manner, the LED device 1 shown in FIG. 1 and FIG. 2 is produced.

In this LED device 1, when a predetermined voltage is applied between the n-type electrode 26 and the p-type electrode 25 from a direct current power supply (not shown in the drawing) through the lead frame electrodes 41A and 41B and the bonding wires 42A and 42B, a current is injected into the active layer 23 via the n-type clad layer 22 or the p-type clad layer 24. In the active layer 23, electron-hole recombination is effected by the injected current, and light is generated. In the resulting light, the light emitted toward the transparent substrate 21 side is emitted, as it is, via the transparent substrate 21, the shielding film 51, and the cap 52. On the other hand, the light emitted toward the p-type electrode 25 side is reflected by this p-type electrode 25, and is guided toward the transparent substrate 21 side. In this manner, the light generated from the active layer 23 is finally emitted as the emitted light L1 toward the transparent substrate 21 side, that is, the cap 52 side of the LED device 1.

Here, in this LED device 1, since the shielding film 51 is disposed between the LED chip 2 and the cap 52, movement of elements between the LED chip 2 and the cap 52 due to ion migration or the like is suppressed, and the occurrence of reaction between the metal elements in the LED chip 2, specifically metal elements contained in the p-type electrode 25 and the thermally conductive adhesive 33 and a sulfur or halogen element in the cap 52 is avoided.

Since this shielding film 51 and the cap 52 are composed of the materials capable of transmitting the light L1 from the LED chip 2, the light extraction efficiency of the emitted light L1 may not be reduced in these sections.

As described above, in the present embodiment, since the shielding film 51 is disposed between the LED chip 2 and the cap 52, the reaction between the metal element contained in the p-type electrode 25 in the LED chip 2 and a sulfur (S) or halogen element contained in the cap 52 may be prevented, so that the light extraction efficiency may be improved while deterioration of the light emission characteristic of the LED device 1 with time is prevented.

Furthermore, since metal elements are also contained in the thermally conductive adhesive 33, besides in the LED chip 2, on the LED chip 2 side of the shielding film 51, the reaction between the metal elements contained in the thermally conductive adhesive 33, other than the metal element contained in the p-type electrode 25, and the above-described sulfur or halogen element may also be avoided.

Since the shielding film 51 is formed uniformly between the LED chip 2 and the cap 52, blocking may be conducted more completely as compared with that in the case where the shielding film is formed selectively as described below. Consequently, the above-described reaction may be prevented more effectively.

In the case where the refractive index of the shielding film 51 is allowed to satisfy the above-described formula (1) or the formula (2), the Fresnel reflection at each interface may be suppressed when the light is emitted from the LED chip 2 toward the outside. Therefore, the reflectance with respect to the light L1 may be reduced and the light extraction efficiency may be further improved.

In the case where the refractive index and the film thickness of the shielding film 51 is allowed to satisfy the above-described formula (3) in addition to the above-described formula (1) or the formula (2), the reflectance with respect to the light L1 may be reduced by the interference of the luminous flux, and the light extraction efficiency may be further improved.

In the case where the refractive index of the shielding film 51 is also allowed to satisfy the above-described formula (4) in addition to the above-described formula (1) to the formula (3), the reflectance with respect to the light L1 corresponding to the peak lasing wavelength λ can be made nearly zero. Therefore, the light extraction efficiency may be maximized.

In the case where the materials capable of constituting the shielding film 51 are combined and the shielding film 51 is composed of at least one type selected from the group consisting of these materials, the refractive index of the shielding film 51 can be adjusted freely by changing the compositional ratio of each material. Consequently, it becomes possible to set the refractive index of the shielding film 51 in such a way as to satisfy the above-described formula (1) to the formula (4) by adjusting the compositional ratio of each material.

Furthermore, since the shielding film 51 is formed uniformly on the back of the cap 52 and, thereafter, this is joined with the LED chip 2 and the like so as to produce the LED device 1, the shielding film 51 can easily be formed and the production can be conducted without specific complication as compared with that of the known LED device.

In a specific example (Example 1) according to the present embodiment, a sapphire substrate (refractive index ni=1.76) is used as the transparent substrate 21, a sulfur-containing polyurethane based resin (refractive index nc=1.70) is used as the constituent resin of the cap 52, $Al_2O_3$ (refractive index np=1.76) having a thickness of 230 nm is used as the shielding film 51, and a GaN based or InGaN based semiconductor, which is a green-blue-emitting material and which covers the wavelength range of about 430 to 560 nm, is used as the semiconductor layered structure. The shielding film 51 composed of $Al_2O_3$ is formed by a reactive DC sputtering method, in which $O_2$ is introduced and an $Al_2$ target is used. In this Example 1, when the wavelength $\lambda$ in a maximum peak intensity region is 540 nm, the above-described formula (2) and the formula (3) are satisfied (in the formula (3), m=1).

In another example (Example 2) according to the present embodiment, SiOxNy (refractive index np=1.73) having a thickness of 230 nm is used as the shielding film 51. The shielding film 51 composed of SiOxNy is formed by a reactive RF sputtering method, in which $N_2$ is introduced and an $SiO_2$ target is used. In this Example 2, when the wavelength $\lambda$ in a maximum peak intensity region is 530 nm, the above-described formula (2) to the formula (4) are satisfied (in the formula (3), m=1). Therefore, the light extraction efficiency is more improved as compared with that in the above-described Example 1.

The semiconductor light emitting device according to other embodiments of the present invention will be described below. The same constituent elements as those in the first embodiment are indicated by the same reference numerals as those set forth above and explanations thereof will not be provided appropriately.

Second Embodiment

Figure 3:
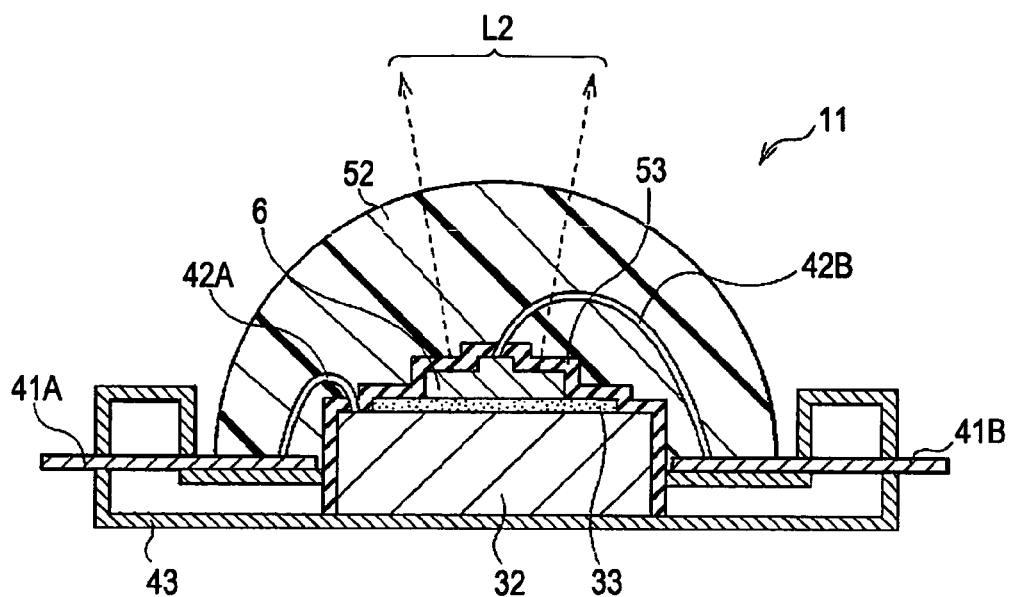
FIG. 3 is a sectional view showing the configuration of a semiconductor light emitting device according to a second embodiment.

FIG. 3 shows a cross-sectional configuration of a semiconductor light emitting device (LED device 11) according to the second embodiment of the present invention.

In this LED device 11, a top surface-emitting type LED chip 6, as described below, is disposed in place of the flip chip type LED chip 2 explained in the first embodiment (LED device 1). Therefore, the sub-mount substrate 31 is not disposed in this LED device 11, and the LED chip 6 and the slug 32 are bonded directly to each other with the thermally conductive adhesive 33. The bonding wire 42B is connected to the top surface of the LED chip 6 rather than the side surface.

Figure 4:
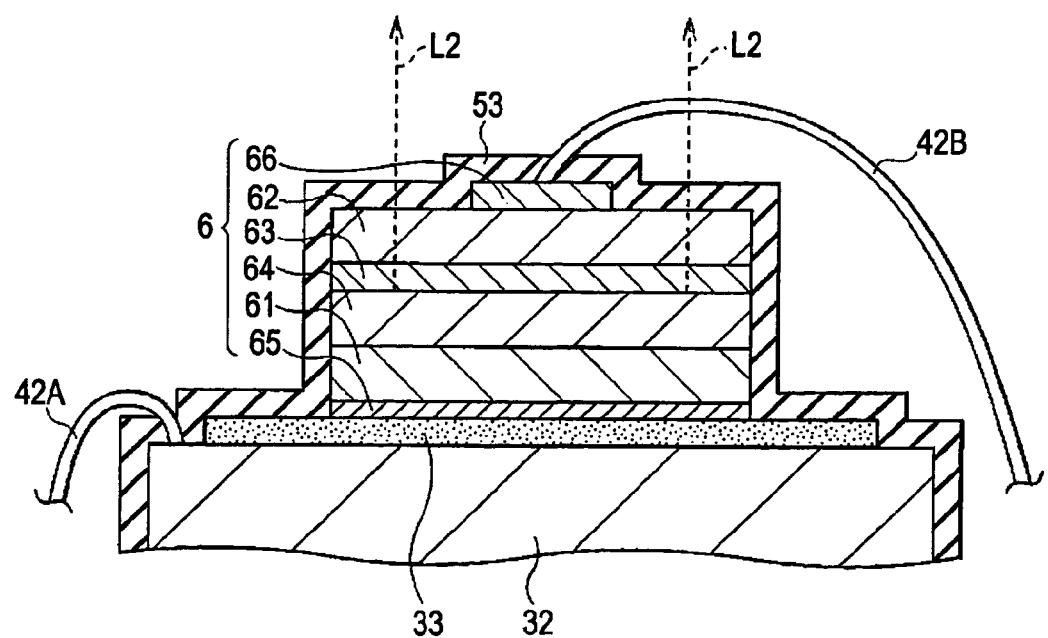
FIG. 4 is a sectional view showing a detailed configuration of the LED chip shown in FIG. 3 and its vicinity.

FIG. 4 shows a cross-sectional configuration of a part (LED chip 6 and its vicinity) of this LED device 11 in detail. This top surface-emitting type LED chip 6 emits (emitted light L2) the light L2, as it is generated from the active layer 63, upward (toward the surface side). The LED chip 6 has a substrate 61 opaque with respect to the light L2 generated from the active layer 63. A p-type clad layer 64, the active layer 63, and an n-type clad layer 62 are disposed sequentially and uniformly on the surface of the substrate 61 so as to constitute a layered structure. An n-type electrode 66 is disposed on a part of the n-type clad layer 62, and a p-type electrode 65 is disposed uniformly on the back of the substrate 61. The n-type electrode 66 is electrically connected to a lead frame electrode 41B via the bonding wire 42B. The p-type electrode 65 is electrically connected to a lead frame electrode 41A via the thermally conductive adhesive 33, the slug 32, and the bonding wire 42A.

The substrate 21 is composed of, for example, a gallium arsenide (GaAs) substrate or a silicon (Si) substrate. Each of the p-type clad layer 64, the active layer 63, the n-type clad layer 62, the n-type electrode 66, and the n-type electrode 65 is composed of, for example, an AlInGaP based semiconductor, which is a red-emitting material and which covers the wavelength range of about 610 to 640 nm, or a GaN based or InGaN based semiconductor, which is a green·blue-emitting material and which covers the wavelength range of about 430 to 560 nm. When this semiconductor layered structure is composed of the red-emitting material, the peak lasing wavelength $\lambda$ in the above-described formula (3) becomes about 630±30 mm.

FIG. 3 will be further described. In this LED device 11, a shielding film 53 is disposed uniformly between the cap 52 and the LED chip 6, specifically on the side surfaces and the top surfaces of the slug 32 and the LED chip 6 in place of the shielding film 51 in the first embodiment.

This shielding film 53 is composed of an insulating material among the materials shown in Table 1. Specifically, the shielding film 53 is composed of, for example, silicon oxide ($SiO_2$), silicon nitride ($Si_3N_4$), aluminum oxide ($Al_2O_3$), aluminum nitride (AlN), or a combination of these materials. This is because when the shielding film is composed of an electrically conductive material, the n-type electrode 66 and the p-type electrode 65 are electrically short-circuited due to the shielding film 53, in contrast to the shielding film 51 in the first embodiment.

The configurations of other potions are similar to those in the LED device 1 explained in the first embodiment.

This LED device 11 can be produced as described below, for example.

The LED chip 6 is formed. Specifically, a semiconductor layered structure including the p-type clad layer 64, the active layer 63, and the n-type clad layer 62 composed of the above-described materials is formed on the surface of the substrate 61 composed of the above-described material, as in the first embodiment. Subsequently, the p-type electrode 65 is formed uniformly on the back side of the substrate 61, and the n-type electrode 66 is formed on a part of the n-type clad layer 62. This n-type electrode 66 is formed by working through the use of, for example, RIE or FIB. In this manner, the LED chip 6 shown in FIG. 4 is formed.

The LED chip 6 is bonded to the slug 32 with the thermally conductive adhesive 33. The shielding film 53 composed of the above-described material is formed to have a uniform thickness of about 220 to 230 nm on the side surfaces and top surfaces of the slug 32 and the LED chip 6 by a reactive DC sputtering method, for example.

As in the first embodiment, the slug 32 and a part of the lead frame electrodes 41A and 41B are attached to the case 43. The bonding wires 42A and 42B are allowed to connect between the p-type electrode 65 and the n-type electrode 66 in the LED chip 6 and the lead frame electrodes 41A and 41B, respectively, so that these are electrically connected to each other.

The cap 52 is formed on the structure including the LED chip 6, the slug 32, the shielding film 53, the lead frame electrodes 41A and 41B, and the case 43 by using the above-described resin material, as described below. That is, a thermosetting resin material is used, and molding is performed by using this structure as a lower mold (an upper mold is a common hemispherical mold as in the first embodiment), so that the cap 52 shown in FIG. 3 is formed. In this manner, the LED device 11 shown in FIG. 3 and FIG. 4 is produced.

In this LED device 11, as in the LED device 1, when a predetermined voltage is applied between the n-type electrode 66 and the p-type electrode 65, the active layer 63 emits light. In the resulting light, the light emitted toward the n-type electrode 66 side is emitted, as it is, via the n-type clad layer 62, the shielding film 53, and the cap 52. In this manner, a part of the light generated from the active layer 63 is emitted as the emitted light L2 toward the cap 52 side of the LED device 11.

Here, in this LED device 11, since the shielding film 53 is disposed between the LED chip 6 and the cap 52, specifically, on the side surfaces and the top surfaces of the slug 32 and the LED chip 6, the reaction between the metal elements contained in the LED chip 6 and the thermally conductive adhesive 33 and a sulfur or halogen element contained in the cap 52 is avoided by the operation similar to that in the first embodiment.

However, in the LED device 11 of the present embodiment, since the LED chip 6 is of top surface-emitting type, a component, which is in contact with the shielding film 53 on the LED chip 6 side, is the semiconductor layered structure (in this case, the n-type clad layer 62).

Since the circumference of the LED chip 6 and the thermally conductive adhesive 33 are covered directly with the shielding film 53 with no air layer therebetween, unnecessary reflection of the light L2 at the interface to an air layer is avoided.

As described above, in the present embodiment as well, since the shielding film 53 is disposed between the LED chip 6 and the cap 52, the operation and effect similar to those in the first embodiment are exhibited. That is, the reaction between the metal elements contained in the LED chip 6 and the thermally conductive adhesive 33 and a sulfur or halogen element contained in the cap 52 may be avoided, so that the light extraction efficiency may be improved while deterioration of the light emission characteristic of the LED device 11 with time is prevented.

Since the circumference of the LED chip 6 and the thermally conductive adhesive 33 are covered directly with the shielding film 53, unnecessary reflection of the light L2 may be avoided, and the light extraction efficiency may be further improved as compared with that in the first embodiment.

Figure 5:
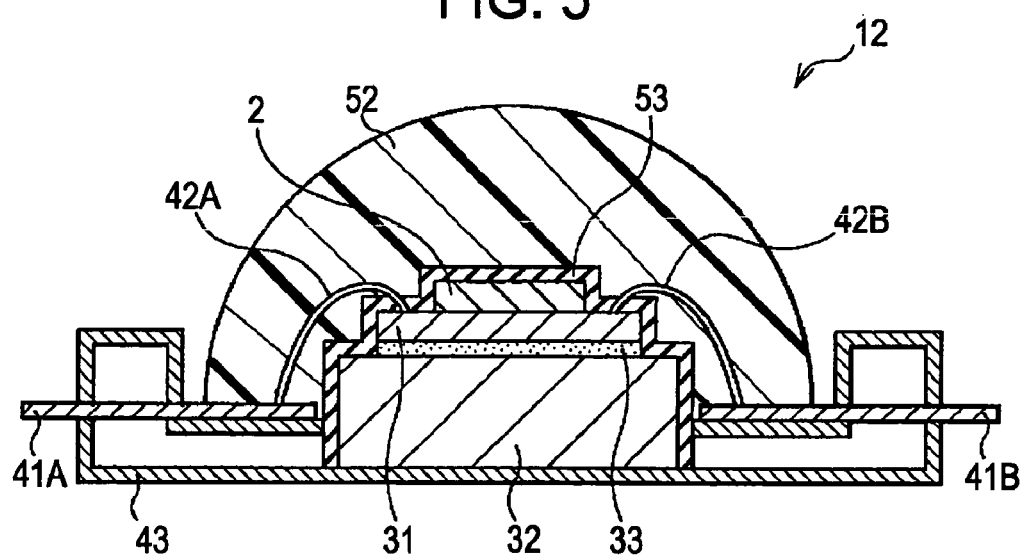
FIG. 5 is a sectional view showing the configuration of a semiconductor light emitting device according to a modified example of the second embodiment.

Furthermore, in the present embodiment, the LED device 11 including the top surface-emitting type LED chip 6 is explained. However, the shielding film 53 explained in the present embodiment can also be applied to an LED device (LED device 12) including a flip chip type LED chip 2, as shown in FIG. 5, for example. In this case, a component, which is in contact with the shielding film 53 on the LED chip 6 side, is the transparent substrate 21 as in the first embodiment.

In the LED device 11, as shown in FIG. 3 and FIG. 4, of a specific example (Example 3) according to the present embodiment, a sulfur-containing polyurethane based resin (refractive index nc=1.70) is used as the constituent resin of the cap 52, AlN (refractive index np=2.15) having a thickness of 220 nm is used as the shielding film 53, and an AlInGaP based semiconductor (refractive index ni=2.86), which is a red-emitting material and which covers the wavelength range of about 610 to 640 nm, is used as the semiconductor layered structure. The shielding film 53 composed of AlN is formed by a reactive DC sputtering method, in which $N_2$ is introduced and an $Al_2$ target is used. In this Example 3, when the wavelength λ in a maximum peak intensity region is 630 nm, the above-described formula (2) and the formula (3) are satisfied (in the formula (3), m=1).

Third Embodiment

Figure 6:
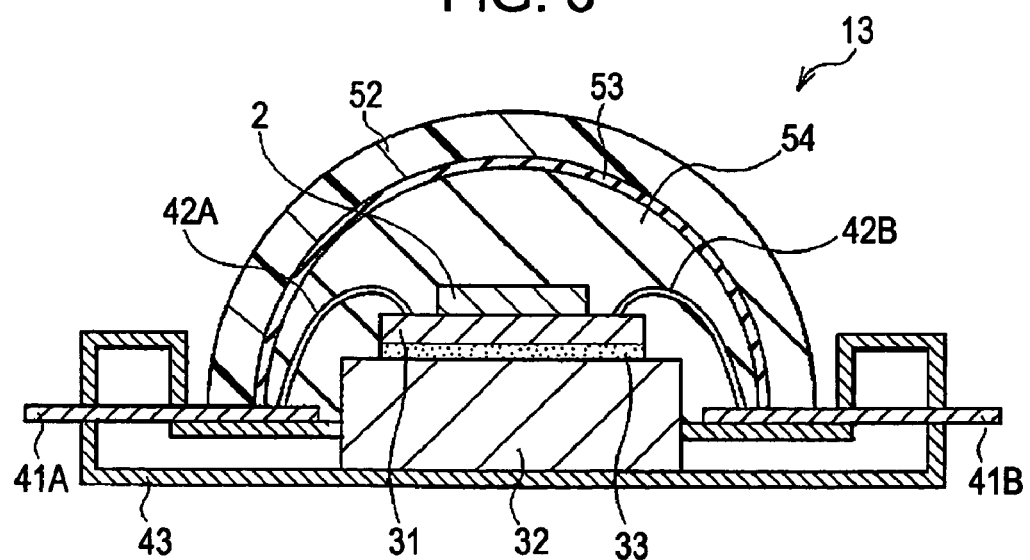
FIG. 6 is a sectional view showing the configuration of a semiconductor light emitting device according to a third embodiment of the present invention.

FIG. 6 shows a cross-sectional configuration of a semiconductor light emitting device (LED device 13) according to the third embodiment.

This LED device 13 corresponds to the LED device 12 of the second embodiment, wherein a filler 54 is injected between the cap 52 and the LED chip 2 and a shielding film 53 is disposed between the LED chip 2 and the filler 54. The configurations of other potions are similar to those in the LED device 12 described in the second embodiment.

The filler 54 is to seal the LED chip 2 against the outside together with the cap 52. However, in contrast to the cap 52, the filler 54 is composed of a material not containing a sulfur (S) nor halogen element, for example, a material, e.g., silicone gel, having high flexibility or a material having high fluidity.

This LED device 13 can be produced as described below, for example.

The LED chip 2 is formed, as in the first embodiment. This is connected to a sub-mount substrate 31, a slug 32, lead frame electrodes 41A and 41B, bonding wires 42A and 42B, and a case 43.

On the other hand, the cap 52 taking the shape as shown in FIG. 6 is formed by molding, as in the first embodiment. The shielding film 53 is formed to have a uniform thickness of about 220 to 230 nm on the inner surface of the resulting cap 52 by, for example, a reactive DC sputtering method, in which $O_2$ or $N_2$ is introduced, or an RF sputtering method.

Finally, the thus formed structure composed of the LED chip 2, the sub-mount substrate 31, the slug 32, the lead frame electrodes 41A and 41B, the bonding wires 42A and 42B, and the case 43 and the structure composed of the cap 52 and the shielding film 53 are opposed to each other, the filler 54 composed of the above-described material is injected between the LED chip 2 and the shielding film 53, so that the LED device 13 shown in FIG. 6 is produced. At this time, the structure composed of the cap 52 and the shielding film 53, in which the filler 54 has been injected, may be joined with the structure composed of the LED chip 2, the sub-mount substrate 31, the slug 32, the lead frame electrodes 41A and 41B, the bonding wires 42A and 42B, and the case 43. In the case where the filler 54 is composed of a thermosetting resin, after the filler 54 is injected, heating may be performed at about 10° C. to 120° C. so as to cure and, thereby, this filler 54 may also be allowed to function as an adhesive.

In the LED device 13 of the present embodiment, since the shielding film 53 is disposed between the LED chip 2 and the cap 52, specifically, between the LED chip 2 and the filler 54, the reaction between the metal elements contained in the LED chip 2 and the thermally conductive adhesive 33 and a sulfur or halogen element contained in the cap 52 is avoided by the operation similar to that in the first embodiment.

However, in the LED device 13, a component, which is in contact with the shielding film 53 on the LED chip 2 side, is the filler 54, as shown in FIG. 6.

As described above, in the present embodiment as well, since the shielding film 53 is disposed between the LED chip 2 and the cap 52, the operation and effect similar to those in the first and the second embodiments are exhibited. That is, the reaction between the metal elements contained in the LED chip 2 and the thermally conductive adhesive 33 and a sulfur or halogen element contained in the cap 52 may be avoided, so that the light extraction efficiency may be improved while deterioration of the light emission characteristic of the LED device 13 with time is prevented.

In the LED device 13 of the present embodiment, it is desirable that the refractive index of the filler 54 and the refractive index of the component, which is in contact with this filler 54 on the LED chip 2 side, are allowed to become close to each other. This is because unnecessary reflection at the interface between the LED chip 2 and the filler 54 can be suppressed. In particular, in the case where the refractive index of the filler 54 is smaller than the refractive index of the transparent substrate 21 in the LED chip 2, the light L1 from the active layer 23 may be totally reflected depending on the angle with respect to the interface thereof. However, the above-described total reflection can be suppressed by allowing the refractive index values to become close to each other.

Figure 7:
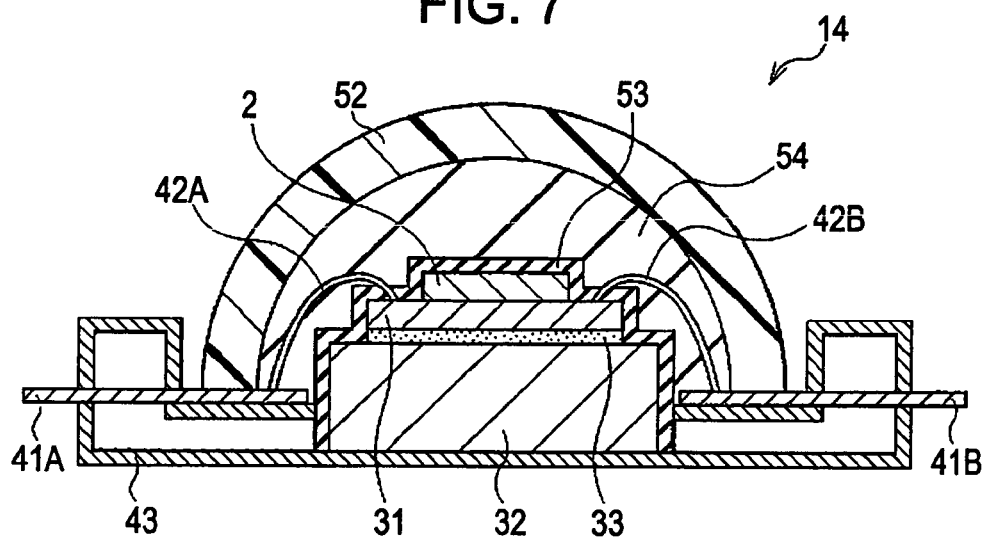
FIG. 7 is a sectional view showing the configuration of a semiconductor light emitting device according to a modified example of the third embodiment.

In the case where the filler 54 has been injected as in, for example, a LED device 14 shown in FIG. 7, the shielding film 53 may be formed directly on the side surfaces of the slug 32 and the LED chip 2. In this case, a component, which is in contact with the shielding film 53 on the LED chip 2 side, is the transparent substrate 21 because the LED chip 2 is of flip chip type.

Furthermore, in the present embodiment, the LED device 13 including the flip chip type LED chip 2 is explained. However, the disposition of the filler 54 and the shielding film 53 described in the present embodiment can be applied to the LED device including the top surface-emitting type LED chip 6 described in the second embodiment. In this case, a component, which is in contact with the shielding film 53 on the LED chip 6 side, is the semiconductor layered structure (n-type clad layer 62) as in the second embodiment.

In the LED device 13, as shown in FIG. 6, of a specific example (Example 4) according to the present embodiment, a sapphire substrate is used as the transparent substrate 21, a sulfur-containing polyurethane based resin (refractive index nc=1.60) is used as the constituent resin of the cap 52, SiOxNy (refractive index np=1.62) having a thickness of 230 nm is used as the shielding film 53, silicone gel (refractive index ni=1.65) is used as the filler 54, and a GaN based or InGaN based semiconductor, which is a green-blue-emitting material and which covers the wavelength range of about 430 to 560 nm, is used as the semiconductor layered structure. The refractive index of SiOxNy is different from that in Example 2 because the ratio of the oxygen content x to the nitrogen content y is different. In this Example 4, when the wavelength λ in a maximum peak intensity region is 497 nm, the above-described formula (2) to the formula (4) are satisfied (in the formula (3), m=1).

Up to this point, the present invention has been described with reference to the first to the third embodiments. However, the present invention is not limited to these embodiments, and various modifications can be made.

Figure 8:
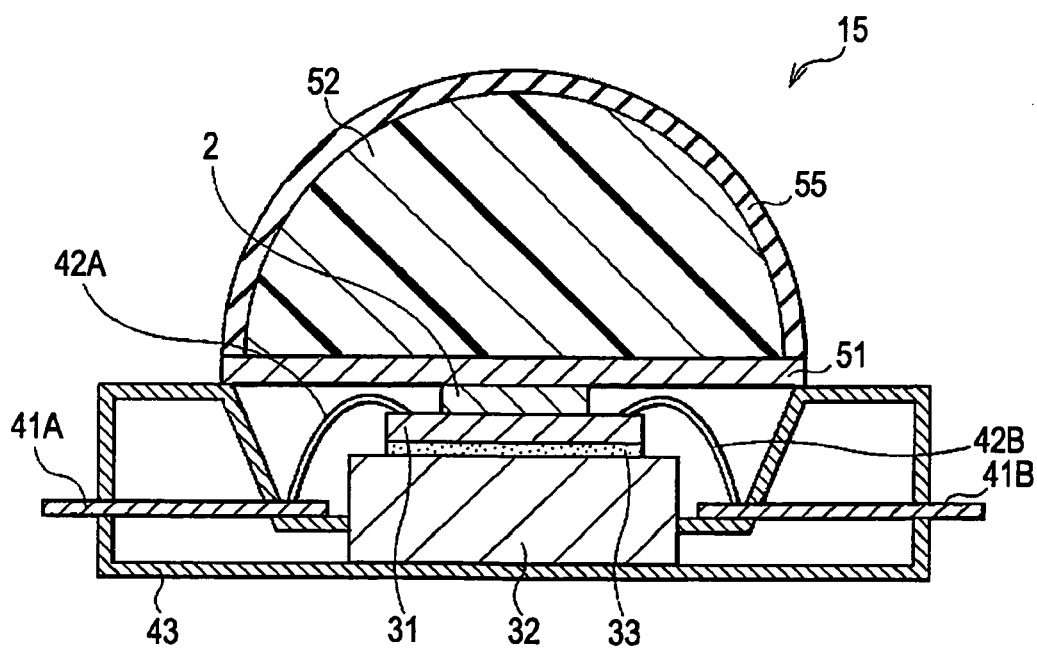
FIG. 8 is a sectional view showing the configuration of a semiconductor light emitting device according to a modified example of the present invention.

For example, as in a LED device 15 shown in FIG. 8, a reflectance adjustment layer 55 for adjusting the reflectance at the interface between a cap 52 and an air layer may be disposed on an outer surface of the cap 52. According to this configuration, it becomes possible to adjust in such a way that unnecessary reflection at the interface between this cap 52 and the air layer is reduced. Consequently, it becomes possible to further improve the light extraction efficiency of the LED device as compared with that in the above-described embodiment. FIG. 8 shows the case where the reflectance adjustment layer 55 is disposed in the LED device 1 (FIG. 1) of the first embodiment. Likewise, this can also be applied to the LED devices of other embodiments.

In the above-described embodiments, the shielding film 51 or 53 is formed uniformly between the LED chip 2 or 6 and the cap 52. However, in the case where the metal element is contained merely in the LED chip, the shielding film may be disposed selectively at the position corresponding to the electrode containing the metal element between the LED chip and the cap 52. According to this configuration as well, the reaction between the metal elements and a sulfur or halogen element in the cap 52 may be avoided, so that the light extraction efficiency may be improved while deterioration of the light emission characteristic of the LED device with time is prevented.

In the above-described embodiments, the semiconductor layered structure in the LED chip 2 or 6 is composed of the red-emitting material, the green-emitting material, or the blue-emitting material which emits the light in a predetermined wavelength region. This LED chip may emit white light. Specifically, the semiconductor layered structure in the LED chip is composed of a blue-emitting material or a violet-emitting material and, in addition, a mixture of a yellow luminophor or a red luminophor and a green luminophor is applied on an outer surface of this LED chip. Alternatively, a yellow luminophor or a red luminophor and a green luminophor are added to a resin cap layer so as to cause chromatic dispersion. In this case, the peak lasing wavelength λ of the LED chip is about 380 to 780 nm corresponding to an entire visible light region.

Figure 9:
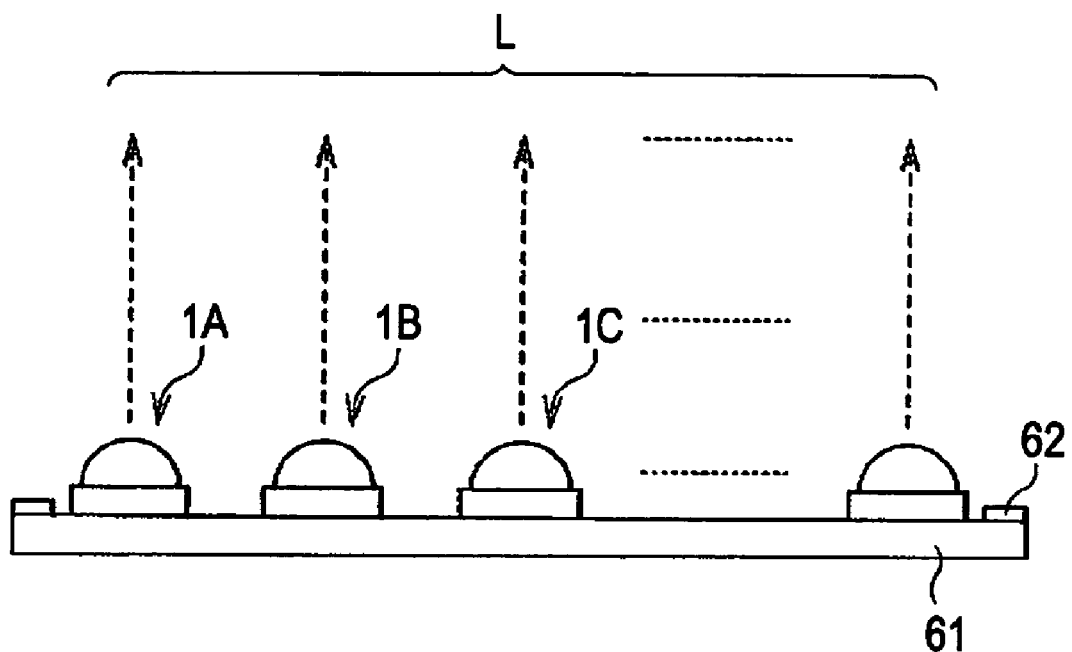
FIG. 9 is a side view showing the configuration of a semiconductor light emitting device assembly including semiconductor light emitting devices according to an embodiment of the present invention.
Figure 10:
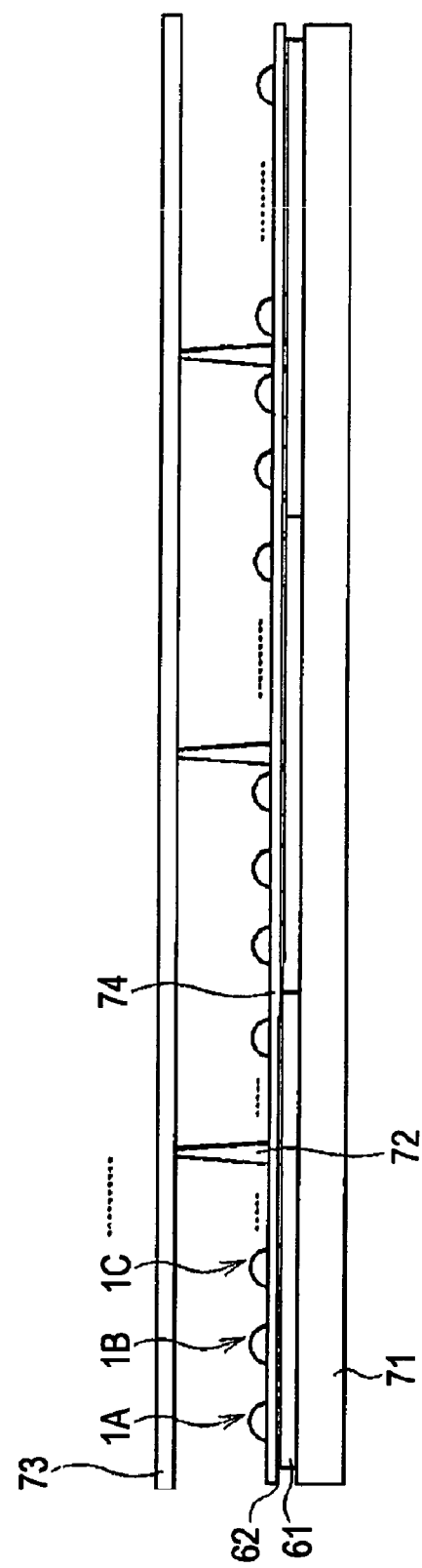
FIG. 10 is a side view showing the configuration of a light source device including the semiconductor light emitting device assemblies shown in FIG. 9.
Figure 11:
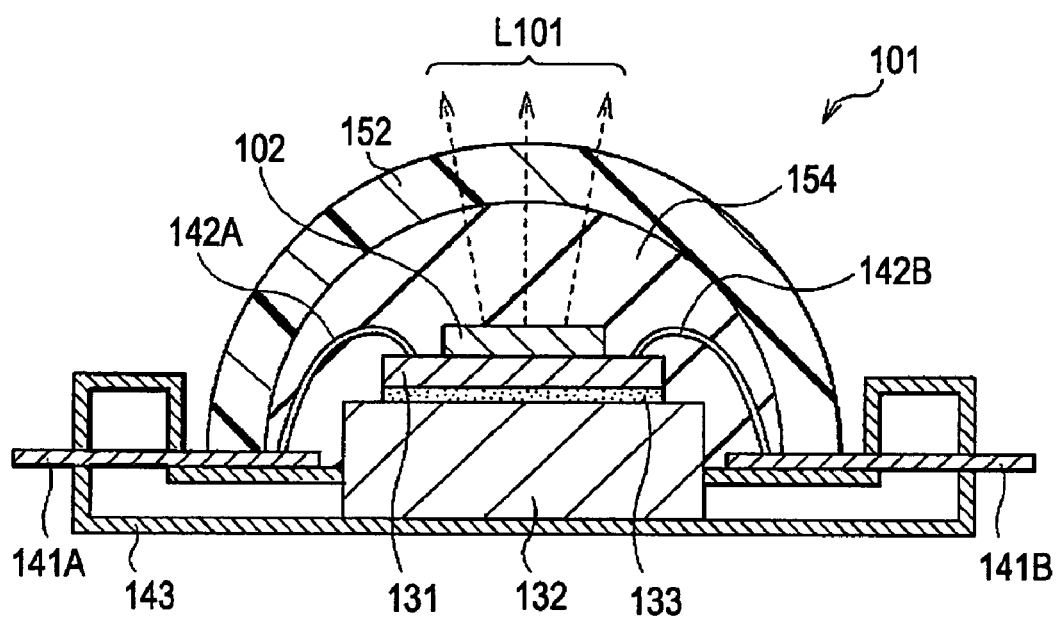
FIG. 11 is a sectional view showing the configuration of a known semiconductor light emitting device.
Figure 12:
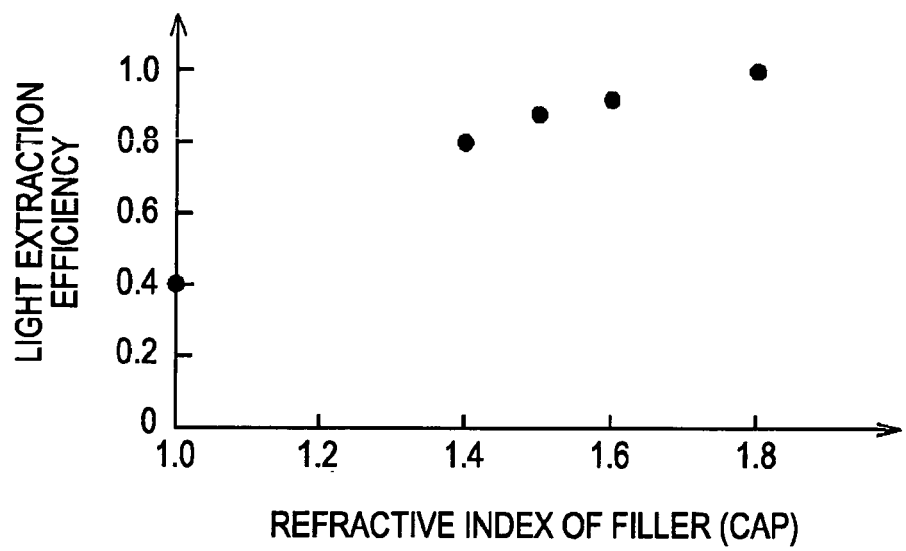
FIG. 12 is a characteristic diagram showing the relationship between the refractive index of a filler or a cap and the light extraction efficiency in the known semiconductor light emitting device.
Figure 13:
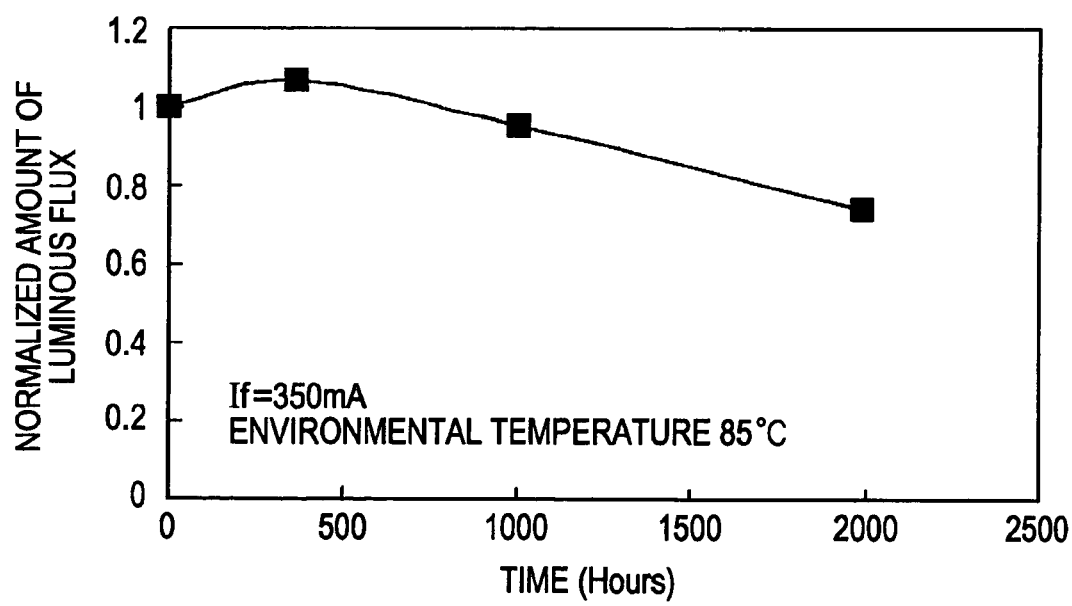
FIG. 13 is a characteristic diagram showing the change with time of the amount of luminous flux of the light emitted from the known semiconductor light emitting device.

The semiconductor light emitting device (LED device) according to an embodiment of the present invention can be applied to a semiconductor light emitting device assembly to be used for a light source device of a backlight or the like, as shown in FIG. 9. In that case, for example, a plurality of LED devices (LED device 1A, 1B, 1C, . . . ) explained in the above-described embodiment may be disposed, and each of the plurality of LED devices may be electrically connected to a wiring substrate 61. With respect to the thus configured semiconductor light emitting device assembly as well, by an operation similar to that in the above-described embodiment, a similar effect can be exerted. FIG. 10 shows an example of a light source device including the semiconductor light emitting device assemblies shown in FIG. 9. A plurality of semiconductor light emitting device assemblies are individually mounted on a metal casing 71 and, in addition, are connected to each other with connectors 62. A plurality of supports 72 support between the metal casing 71 and a diffusion plate 73. A diffusion reflection plate 74 is formed uniformly on the plurality of semiconductor light emitting device assemblies. According to such a configuration, in this light source device, the light L from the plurality of LED devices 1A, 1B, 1C, . . . is diffused by the diffusion plate 73 and, in addition, is reflected by the diffusion reflection plate 74, so that the light L is emitted upward in the drawing.

In the LED chips 2 and 6 explained in the above-described embodiments, each of the arrangement of the n-type clad layer and the p-type clad layer and the arrangement of the n-type electrode and the p-type electrode may be configured in reverse.

In the above-described embodiment, the case where the cap 52 takes the shape of a hemisphere with an upper portion having a convex surface is explained. However, the shape of the cap 52 is not limited to this, and the cap 52 may take other shapes.

The material and thickness, or the film formation method and the film formation condition of the various constituent factors explained in the above-described embodiments are not limited. Other materials and thicknesses may be adopted, or other film formation methods and film formation conditions may be adopted.

Furthermore, in the above-described embodiments, specific configurations of the semiconductor light emitting devices are explained. However, all the layers are not always necessary, and other layers may be included.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor light emitting device comprising:
a semiconductor light emitting element containing a metal element;
a cap portion formed from a material which contains a sulfur (S) or halogen element and which is capable of transmitting the light from the semiconductor light emitting element; and
a shielding film disposed between the semiconductor light emitting element and the cap portion and which separates a semiconductor light emitting element side and a cap portion side,
the shielding film adapted to block movement of the metal element between an electrode of the semiconductor light emitting element and the cap portion and which transmits the light from the semiconductor light emitting element to the cap portion,
wherein the shielding film completely contacts the entire upper surface of the semiconductor light emitting element.

2. The semiconductor light emitting device according to claim 1, wherein the semiconductor light emitting element has a semiconductor layered structure including a light emitting layer on a substrate, and
the metal element is contained in an electrode disposed in the semiconductor layered structure.

3. The semiconductor light emitting device according to claim 2,
wherein the substrate is a transparent substrate capable of transmitting the light from the light emitting layer and is in contact with the shielding film.

4. The semiconductor light emitting device according to claim 2,
wherein the semiconductor layered structure is in contact with the shielding film.

5. The semiconductor light emitting device according to claim 2,
wherein the shielding film is disposed selectively at a position corresponding to the electrode.

6. The semiconductor light emitting device according to claim 1,
wherein the shielding film is disposed on a surface on the semiconductor light emitting element side of the cap portion.

7. The semiconductor light emitting device according to claim 1,
wherein the shielding film is disposed uniformly between the semiconductor light emitting element and the cap portion.

8. The semiconductor light emitting device according to claim 1,
wherein a filler is injected between the cap portion and the semiconductor light emitting element.

9. The semiconductor light emitting device according to claim 8,
wherein the shielding film is disposed between the filler and the semiconductor light emitting element.

10. The semiconductor light emitting device according to claim 1,
wherein a component containing the metal element is disposed on the side opposite to the shielding film side of the semiconductor light emitting element.

11. The semiconductor light emitting device according to claim 1,
wherein the metal element is silver (Ag).

12. The semiconductor light emitting device according to claim 1,
wherein when the refractive index of the cap portion is represented by nc, the refractive index of the shielding film is represented by np, and the refractive index of the component, which is in contact with the shielding film on the semiconductor light emitting element side, is represented by ni, the refractive index of the shielding film satisfies at least one of formulae (1) or (2):

$$ni \leq np \leq nc \quad (1)$$

$$ni \geq np \geq nc \quad (2).$$

13. The semiconductor light emitting device according to claim 12,
wherein when the wavelength of the light from the semiconductor light emitting element in a maximum peak intensity region is represented by $\lambda$ and the film thickness of the shielding film is represented by dp, the refractive index and the film thickness of the shielding film satisfy a formula (3):

$$(np \times dp) = (2m+1) \times \lambda/4 \quad (3)$$

where m is an integer of 0 or more.

14. The semiconductor light emitting device according to claim 13,
wherein the peak lasing wavelength ($\lambda$) of the semiconductor light emitting element is 630 ±50 nm.

15. The semiconductor light emitting device according to claim 13,
wherein the peak lasing wavelength ($\lambda$) of the semiconductor light emitting element is 530 ±30 nm.

16. The semiconductor light emitting device according to claim 13,
wherein the peak lasing wavelength ($\lambda$) of the semiconductor light emitting element is 460 ±60 nm.

17. The semiconductor light emitting device according to claim 13,
wherein the refractive index of the shielding film satisfies a formula (4):

$$np = (ni \times nc)^{1/2} \quad (4).$$

18. The semiconductor light emitting device according to claim 1, wherein the shielding film is configured to contain at least one type selected from the group consisting of silicon oxide ($SiO_2$), silicon nitride ($Si_3N_4$), aluminum oxide ($Al_2O_3$), aluminum nitride (AlN), magnesium oxide (MgO), tin oxide (SnO), zinc oxide (ZnO), indium oxide ($In_2O_3$), neodymium oxide ($Nd_2O_3$), titanium oxide ($TiO_2$), and zirconium oxide ($ZrO_2$).

19. The semiconductor light emitting device according to claim 1, wherein a reflectance adjustment layer for adjusting the reflectance at the interface between the cap portion and an air layer is disposed on a surface opposite to the semiconductor light emitting element side of the cap portion.

20. A semiconductor light emitting device assembly to be used for a light source device, the assembly comprising:
a wiring substrate; and
a plurality of semiconductor light emitting devices electrically connected to the wiring substrate, wherein each of the plurality of semiconductor light emitting devices includes a semiconductor light emitting element including a metal element;
a cap portion formed from a material which contains a sulfur (S) or halogen element and which is capable of transmitting the light from the semiconductor light emitting element, the cap portion being hemispherical with an upper portion of the cap portion having a convex surface; and
a shielding film disposed between the semiconductor light emitting element and the cap portion and which separates a semiconductor light emitting element side and a cap portion side,
the shielding film adapted to block movement of the metal element between an electrode of the semiconductor light emitting element and the cap portion and which transmits the light from the semiconductor light emitting element to the cap portion,
wherein the shielding film completely contacts the entire upper surface of the semiconductor light emitting element.

21. The semiconductor light emitting device according to claim 1, wherein the cap portion is hemispherical with an upper portion having a convex surface.

* * * * *